(12) United States Patent
Wieczorek et al.

(10) Patent No.: US 6,306,698 B1
(45) Date of Patent: Oct. 23, 2001

(54) SEMICONDUCTOR DEVICE HAVING METAL SILICIDE REGIONS OF DIFFERING THICKNESSES ABOVE THE GATE ELECTRODE AND THE SOURCE/DRAIN REGIONS, AND METHOD OF MAKING SAME

(75) Inventors: Karsten Wieczorek, Reichenberg-Boxdorf; Michael Raab, Radebeul; Rolf Stephan, Dresden, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/558,963

(22) Filed: Apr. 25, 2000

(51) Int. Cl.$^7$ .................................................. H01L 21/336
(52) U.S. Cl. ....................... 438/197; 438/682; 438/683; 438/684; 438/685
(58) Field of Search .................................. 438/682, 683, 438/684, 685, 197

(56) References Cited

U.S. PATENT DOCUMENTS

| | | | |
|---|---|---|---|
| 4,897,368 | 1/1990 | Kobushi et al. | 437/200 |
| 5,034,348 | 7/1991 | Hartswick et al. | 437/200 |
| 5,447,875 | 9/1995 | Moslehi | 437/41 |
| 6,107,176 | * 8/2000 | Fazan et al. | 438/592 |

OTHER PUBLICATIONS

Goto et al., "Optimization of Salicide Processes for sub 0.1–μm CMOS Devices," 1994 Symposium on VLSI Technology Digest of Technical Papers, pp. 119–120, Apr. 1994.

Sohn et al., "High Thermal Stability and Low Junction Leakage Current of Ti Capped Co Salicide and its Feasibility for High Thermal Budget CMOS Devices," Mar. 1998.

Goto et al., "A New Leakage Mechanism of Co Salicide and Optimized Process Conditions," *IEEE Transactions on Electron Devices,* vol. 46, No. 1, p. 117, Jan. 1999.

* cited by examiner

*Primary Examiner*—Long Pham
(74) *Attorney, Agent, or Firm*—Williams, Morgan & Amerson, P.C.

(57) ABSTRACT

The present invention is directed to a semiconductor device (100) having enhanced electrical performance characteristics, and a method of making such a device. In one illustrative embodiment, the semiconductor device (100) is comprised of a polysilicon gate electrode (104) positioned above a gate insulation layer (105), a plurality of source/drain regions (109) formed in a semiconducting substrate (101), a first metal silicide region (111A) positioned above the gate electrode (104), a second metal silicide region (107) positioned above each of the source/drain regions (109), wherein the first metal silicide region (111A) is approximately 2–10 times thicker than each of the second metal silicide regions (107). In one illustrative embodiment, the inventive method disclosed herein comprises forming a first layer of a refractory metal (110) above a layer of polysilicon (104), and converting the refractory metal layer (110) to a metal suicide layer (111), and patterning the metal silicide layer (111) and the gate electrode layer (104) to form a metal silicide region (111A) above the gate electrode (104). The method further comprises forming a plurality of source/drain regions (109) in the substrate (101), forming a second layer comprised of a refractory metal above at least the gate stack (122) and the source/drain regions (109). The method concludes with converting at least a portion of the second layer of refractory metal to a second metal silicide region above each of the source/drain regions (109).

17 Claims, 3 Drawing Sheets

SEMICONDUCTOR DEVICE HAVING METAL SILICIDE REGIONS OF DIFFERING THICKNESSES ABOVE THE GATE ELECTRODE AND THE SOURCE/DRAIN REGIONS, AND METHOD OF MAKING SAME

REFERENCE TO RELATED APPLICATIONS

The device described herein may also be manufactured using the methods described in our co-pending patent applications entitled "Method of Forming Metal Silicide Regions on a Gate Electrode and on the Source/Drain Regions of a Semiconductor Device U.S. Ser. No. 09/557,713," "Method of Forming a Low Resistance Metal Silicide Region on a Gate Electrode of a Transistor U.S. Ser. No. 09/557,697," and "Method of Forming a Transistor Having a Low-Resistance Gate Electrode" U.S. Pat. No. 6,268,257, each of which are hereby incorporated by reference in their entirety.

BACKGROUND OF THE INVENTION

1. Field of the Invention

The present invention is generally related to the field of semiconductor processing, and, more particularly, to a semiconductor device having metal silicide regions of differing thicknesses above the source/drain regions and the gate electrode of the device, and a method of making same.

2. Description of the Related Art

In the field of semiconductor integrated circuit devices, design features, e.g., gate length, channel length, are being steadily decreased in order to achieve higher package densities and to improve device performance. The rapid advance of field effect transistor design has affected a large variety of activities in the field of electronics in which the transistors are operated in a binary switching mode. In particular, complex digital circuits, such as micro-processors and the like, demand fast-switching transistors. Accordingly, the distance between the drain region and the source region of a field effect transistor, commonly referred to as the channel length or gate length dimension, has been reduced to accelerate the formation of a conductive channel between a source and a drain electrode as soon as a switching gate voltage is applied and, moreover, to reduce the electrical resistance of the channel.

Thus, a transistor structure has been created where the longitudinal dimension of the transistor, commonly referred to as the width dimension, extends up to 20 $\mu$m, whereas the distance of the drain and source, i.e., the gate length, may be reduced down to 0.2 $\mu$m or less. As the gate length of the channel has been reduced to obtain the desired switching characteristic of the drain-source line, the length of the gate electrode is also reduced. Since the gate electrode is typically contacted at one end of its structure, the electrical charges have to be transported along the entire width of the gate electrode, i.e., up to 20 $\mu$m, to uniformly build up the transverse electric field that is necessary for forming the channel between the drain and source regions. Due to the small length of the gate electrode, which usually consists of polycrystalline silicon, the electrical resistance of the gate electrode is relatively high, and it may cause high RC-delay time constants. Hence, the transverse electrical field necessary for fully opening the channel is delayed, thereby further deteriorating the switching time of the transistor line. As a consequence, the rise and fall times of the electrical signals are increased and the operating frequency, i.e., the clock frequency, has to be selected so as to take into account the aforementioned signal performance.

In view of the foregoing, the switching times of field effect transistors are no longer only limited by the drain and source characteristics, i.e., dimension and resistance, but also significantly depend on the signal propagation along the gate electrode. However, the resistance of the gate electrode affects the propagation time of a signal along the gate width direction. To minimize the electrical resistance of the drain and source regions, as well as that of the gate electrode, a silicidation process is usually performed in which a portion of the aforementioned regions are transformed into a metal silicide region in order to lower the respective electrical resistances. The depth of the metal silicide regions on the surfaces of the drain region, source region and gate electrode is limited by the requirements for the integrity of shallow drain/source junctions. That is, the metal suicide regions can only be made a certain thickness without adversely impacting the source/drain regions.

With reference to FIGS. 1A–1C, an illustrative example of forming a MOS transistor according to a typical prior art process will be described. It is to be noted that the drawings in this application are merely schematic depictions of the various stages in manufacturing the illustrative device under consideration. The skilled person will readily appreciate that the dimensions shown in the drawings are not true to scale, and that different portions or layers are not separated by sharp boundaries as portrayed in the drawings but may instead comprise continuous transitions. Furthermore, various process steps, as described below, may be performed differently depending on particular design requirements. Moreover, in this description, only the relevant steps and portions of the device necessary for the understanding of the present invention are considered.

FIG. 1A shows a schematic cross-section through an illustrative MOS transistor at a specific stage of a typical prior art manufacturing process. Within a silicon substrate 1, a plurality of shallow trench isolations 2 comprised of, for example, silicon dioxide, are formed. The trench isolations 2 define a transistor active region 3 in which a channel region, a drain region and a source region will be formed. Over the transistor active region 3, a gate electrode 4 is formed. The gate electrode 4 may be comprised of a variety of materials, such as polycrystalline silicon. A thin gate insulation layer 5 separates the gate electrode 4 and the transistor active region 3. The process steps involved in patterning the gate electrode 4 are of common knowledge to the skilled person, and usually include photolithography and etching steps. Since these procedures are commonly known, the description thereof will be omitted. Moreover, sidewall spacers 8, usually consisting of, for example, silicon dioxide or silicon nitride, may be formed adjacent the sidewalls of the gate electrode 4 for aiding the forming of drain and source regions 9.

Next, as shown in FIG. 1B, a metal layer 6 is deposited over the transistor shown in FIG. 1A. The metal layer 6 may consist of a refractory metal, such as titanium, cobalt, etc., and it is provided in order to feed a subsequent silicidation process which is initialized by a heat treatment such as rapid thermal annealing (RTA). After the heat treatment, the portion of the metal layer 6 which has not reacted with the exposed surfaces of the transistor active region 3 and the gate electrode 4 is removed.

FIG. 1C schematically shows the cross-section of the MOS transistor shown in FIG. 1A and 1B after a further heat treatment, such as an RTA process, has been performed. Through this further heat treatment, the silicided portions of the drain and source regions 9, as well as of the gate electrode 4, are converted into a low-resistance phase, e.g., a metal silicide. Accordingly, metal silicide portions 7 are formed on the source and drain regions 9 and a metal silicide portion 10 is formed on the upper surface of the gate electrode 4. The depth of the metal silicide portion 10 on the gate electrode 4 is limited by the depth of the metal silicide regions formed on the drain and source regions 9. That is, using traditional silicidation processing, the thickness of the metal silicide portion 10 cannot be made too thick; otherwise, too much of the source/drain regions 9 will be consumed during the silicidation process. Accordingly, the major part of the gate electrode 4 is maintained as polycrystalline silicon having a relatively low conductivity. As previously discussed, such an arrangement will cause a delay in charge carrier transportation along the gate width, whereby the signal performance of the device deteriorates.

In view of the above-mentioned problems, a need exists for a transistor having an increased signal performance and for a method of fabricating such a device. The present invention is directed to a method of making a semiconductor device that solves, or at least reduces, some or all of the aforementioned problems.

SUMMARY OF THE INVENTION

The present invention is directed to a semiconductor device having enhanced electrical performance characteristics, and a method of making such a device. In one illustrative embodiment, the semiconductor device is comprised of a polysilicon gate electrode positioned above a gate insulation layer, a plurality of source/drain regions formed in a semiconducting substrate, a first metal silicide region positioned above the gate electrode, a second metal silicide region positioned above each of the source/drain regions, wherein the first metal silicide region is approximately 2–10 times thicker than the second metal silicide region. In another illustrative embodiment, the first and second metal silicide regions are comprised of different metal silicides.

In one illustrative embodiment, the inventive method disclosed herein comprises forming a first layer of a refractory metal above a layer of polysilicon, converting the refractory metal layer to a metal silicide layer, and patterning the metal silicide layer and the gate electrode layer to form a gate stack comprised of a metal silicide region above a gate electrode. The method further comprises forming a plurality of source/drain regions in the substrate, forming a second layer comprised of a refractory metal above at least the gate stack and the source/drain regions. The method concludes with converting at least a portion of the second layer of refractory metal to a second metal silicide region above each of the source/drain regions.

BRIEF DESCRIPTION OF THE DRAWINGS

The invention may be understood by reference to the following description taken in conjunction with the accompanying drawings, in which like reference numerals identify like elements, and in which.

Figure 1A:
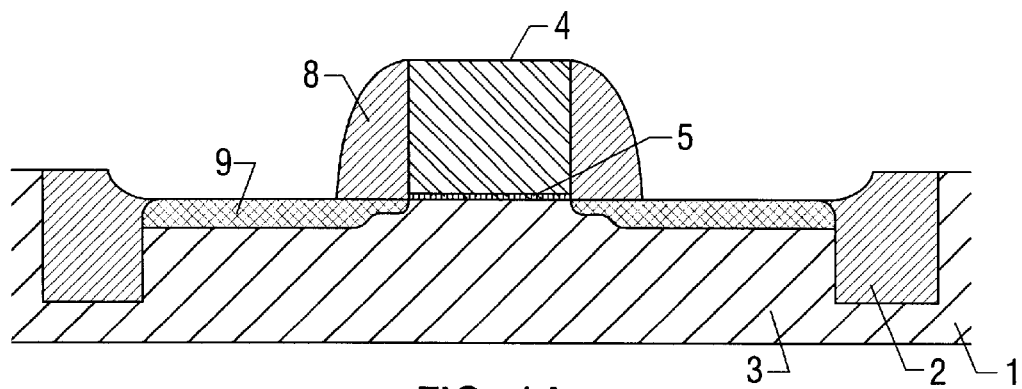
FIG. 1A–1C are schematic cross-sectional views of various stages during the formation of a field effect transistor according to a typical prior art process.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2A–2F. Although the various regions and structures of a semiconductor device are depicted in the drawings as having(g very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming semiconductor device having metal silicide regions of differing thicknesses above the gate electrode and the source/drain regions, and a method of making same. The metal silicide regions may also be comprised of the same or different metal silicides. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2A:
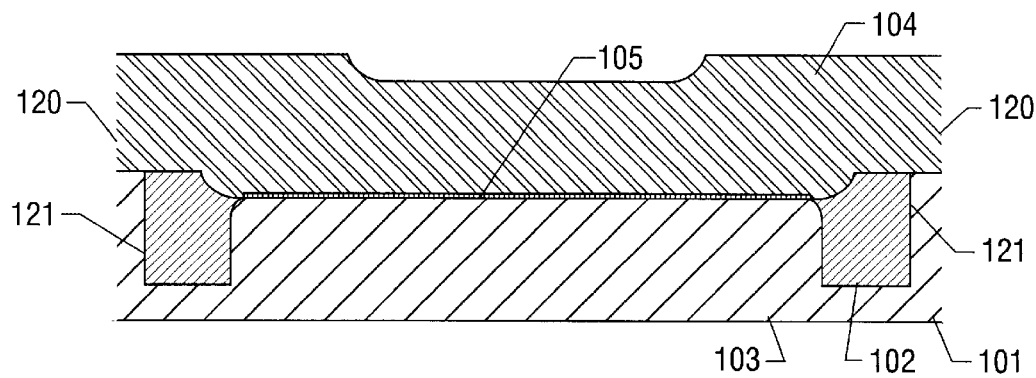
FIGS. 2A–2F are cross-sectional views of illustrative semiconductor devices in various stages of manufacture in accordance with one illustrative embodiment of the present invention.
Figure 2B:
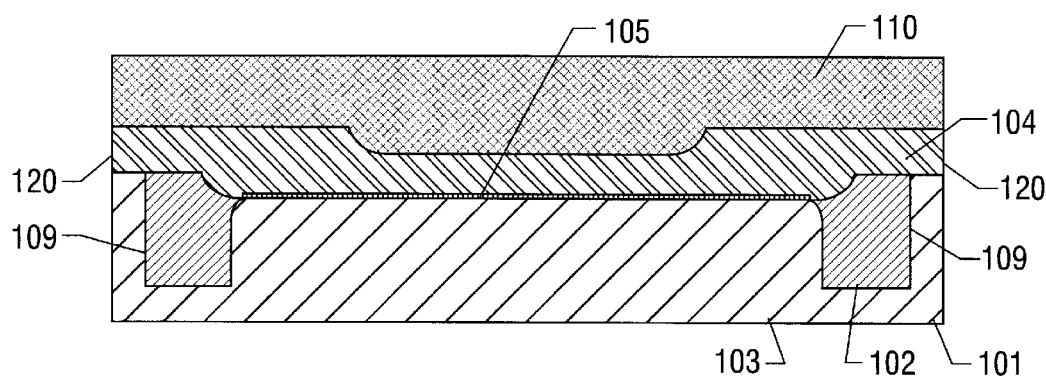
Figure 2C:
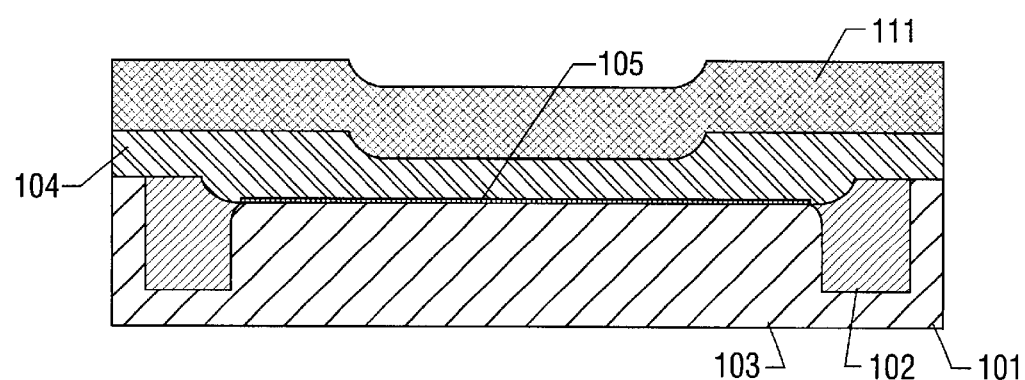
Figure 2D:
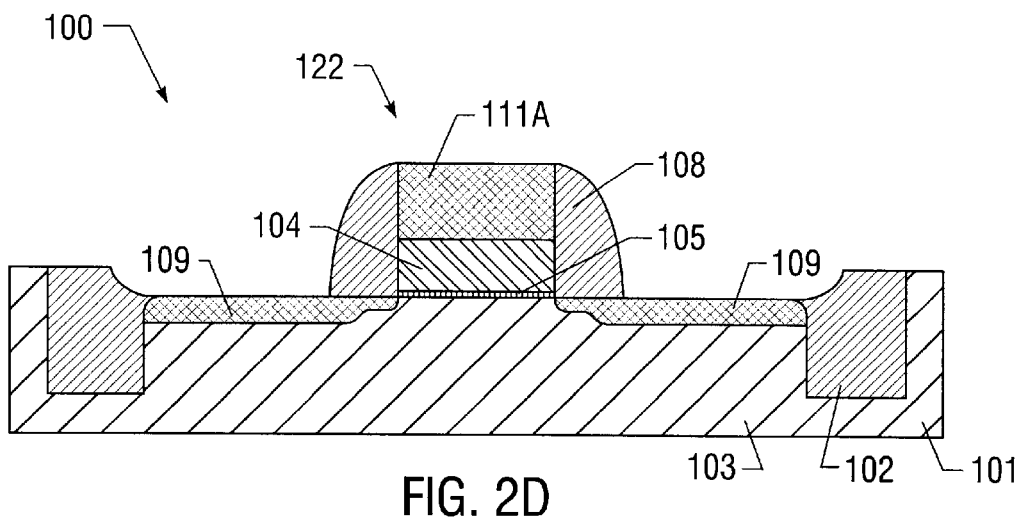

FIGS. 2A–2F depict an illustrative process flow for forming a field effect transistor 100 (see FIG. 2D) above a surface 120 of a semiconducting substrate 103. Although the transistor 100 depicted in FIG. 2D is an NMOS transistor, the present invention is not limited to any particular technology. As shown in FIG. 2A, a plurality of trench isolations 102 are formed in the substrate 101 and thereby define an active area 103 in which the semiconductor device will be formed. The trench isolations 102 may be formed from a variety of materials, e.g., silicon dioxide, silicon oxynitride, etc., and they may be formed using a variety of known techniques. For example, the trench isolations 102 may be formed by performing an anisotropic etching process to define a trench 121 in the substrate 101, and, thereafter, silicon dioxide may be deposited in the trench.

Next, as shown in FIG. 2A, a gate insulation layer 105 is formed above the surface 120 of the substrate 101 in the active region 103 of the device. The gate insulation layer 105 may be formed from a variety of materials, and it may be formed by a variety of techniques. For example, the gate insulation layer 105 may be comprised of silicon dioxide, silicon oxynitride, silicon nitride, or any other material useful as a gate insulation layer. The gate insulation layer 105 may also be formed by a variety of techniques, such as thermal growth, physical vapor deposition ("PVD"), chemical vapor deposition ("CVD"), etc. In one illustrative embodiment, the gate insulation layer 105 is comprised of a thermally grown layer of silicon dioxide having a thickness ranging from approximately 15–50 Å.

Next, as shown in FIG. 2A, a gate electrode layer 104 is formed above the substrate 101 and the gate insulation layer 105. The gate electrode layer 104 may be comprised of a variety of materials, and it may be formed using a variety of known techniques. For example, the gate electrode layer 104 may be comprised of polycrystalline silicon (polysilicon), amorphous silicon, microcrystalline silicon, a silicon germanium compound, etc., and it may be formed by a variety of techniques, such as PVD, plasma enhanced CVD (PECVD), CVD, etc. In one illustrative embodiment, the gate electrode layer 104 is comprised of approximately 1000–4000 Å of polysilicon that is formed by a CVD process.

Next, as shown in FIG. 2B, a layer of refractory metal 110 is formed above the gate electrode layer 104. The refractory metal layer 110 may be comprised of a variety of materials that may subsequently be converted to a metal silicide. For example, the refractory metal layer 110 may be comprised of cobalt, titanium, tantalum, tungsten, molybdenum, zirconium, platinum, nickel, etc. The refractory metal layer 110 may be formed by a variety of known techniques for forming such layers, such as, for example, PVD, PECVD, sputtering, low pressure chemical vapor deposition (LPCVD), etc. Additionally, the thickness of the refractory metal layer 110 may be varied as a matter of design choice, e.g., the refractory metal layer 110 may range in thickness from approximately 200–2000 Å. In one illustrative embodiment, the refractory metal layer 110 is comprised of titanium having a thickness ranging from approximately 350–1500 Å that is formed by a PVD process.

Next, as shown in FIG. 2C, a portion of the refractory metal layer 110 is converted to a metal silicide layer 111 using known silicidation processing techniques. For example, the refractory metal layer 110 may be converted to a metal silicide by performing two rapid thermal anneal (RTA) processes. A first RTA process may be performed at a temperature ranging from approximately 450–600° C. for a duration of approximately 30–60 seconds. Next, unreacted portions of the refractory metal layer 110 are removed by, for example, a dilute acid bath comprised of hydrochloric acid peroxide or sulfuric acid and peroxide. Thereafter, a second rapid thermal anneal process at a temperature ranging from approximately 750–900° C. may be performed for a duration of approximately 30–60 seconds to complete the formation of the metal silicide layer 111.

The thickness of the metal silicide layer 111 may be varied as a matter of design choice. However, using current generation technology, the metal silicide layer 111 may have a thickness ranging from approximately 900–3900 Å. Additionally, it should be noted that during the process of forming the metal silicide layer 111, portions of the gate electrode layer 104 are consumed during this process. For example, using cobalt as the material comprising the refractory metal layer 110, the inventors have found that a thickness of one unit length of cobalt consumes approximately 3.8 units of the thickness of the polysilicon gate electrode layer 104. In one illustrative embodiment, a layer of cobalt that is approximately 25% of that of the polysilicon gate electrode layer 104 results in the formation of a metal silicide region 111A (see FIG. 2D) that is sufficiently thick, yet still preserves a sufficiently thin polysilicon gate electrode 104 over the gate insulation layer 105 (see FIG. 2D). In one illustrative embodiment, where the gate electrode layer 104 is comprised of approximately 1000–4000 Å of polysilicon, and the refractory metal layer 110 is comprised of approximately 350–1500 Å of titanium, the remaining portion of the gate electrode layer 104 depicted in FIG. 2C after the formation of the metal silicide layer 111 may have a thickness ranging(g from approximately 100–500 Å.

If it is desired that the metal silicide region 111A be thinner, then a thinner refractory metal layer 110 may be used. For refractory metals other than cobalt, the corresponding ratios between the thicknesses of the gate electrode layer 104 and the thickness of the refractory metal layer 110 may vary. Moreover, if desired, a thin cap layer consisting of, e.g., titanium nitride (TiN) may be deposited over the respective metal layer prior to the silicidation process so as to prevent the gas in the reaction chamber from reacting with the refractory metal layer 111.

By selecting the thickness of the refractory metal layer to be approximately 25% of the thickness of the gate electrode layer 104, the remaining portion of the polysilicon gate electrode layer 104 positioned above the gate insulation layer 105 insures the well-known and advantageous characteristics of the interface between the polysilicon material and the silicon dioxide of the gate insulation layer 105. Moreover, electrical breakdown owing to metal atoms diffused into gate insulation layer 105 during formation of the transistor device 100 can thus be avoided.

Thereafter, traditional processing techniques are used to form the structure depicted in FIG. 2D. For example, the metal silicide layer 111, the gate electrode layer 104, and the gate insulation layer 105 may be subjected to one or more anisotropic etching processes to define a gate stack 122 comprised of a metal silicide region 111A, a gate electrode 104, and a gate insulation layer 105, as shown in FIG. 2C. Thereafter, an initial ion implant process may be performed to form the extensions of the source/drain regions 109 depicted in FIG. 2D. Next, the sidewall spacers 108 may be formed by blanket depositing a layer of the spacer material, e.g., silicon dioxide, silicon oxynitride, silicon nitride, etc., and thereafter performing an anisotropic etching process to result in the spacers 108 depicted in FIG. 2D. Lastly, a second ion implantation process may be performed at a higher dopant concentration to produce the final source/drain regions 109 depicted in FIG. 2D.

Figure 2E:
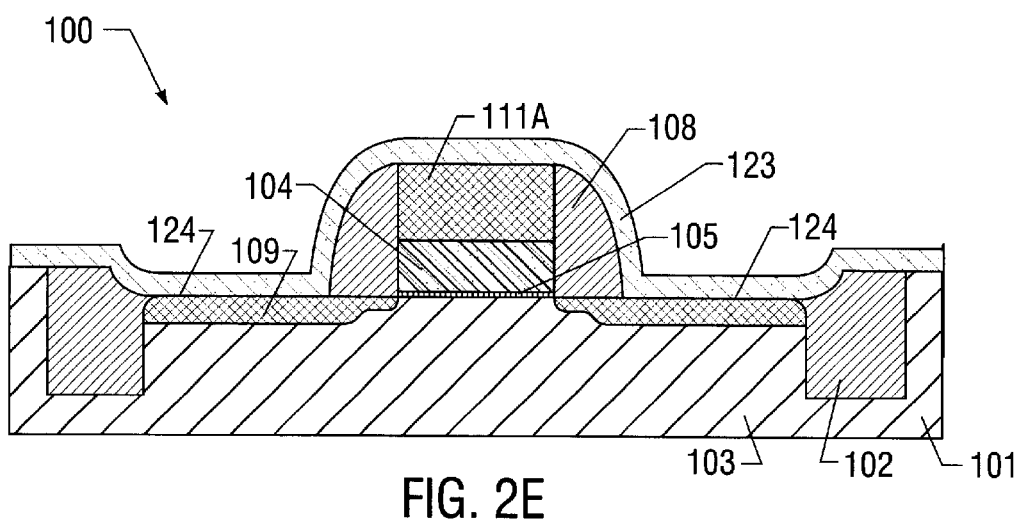
Figure 2F:
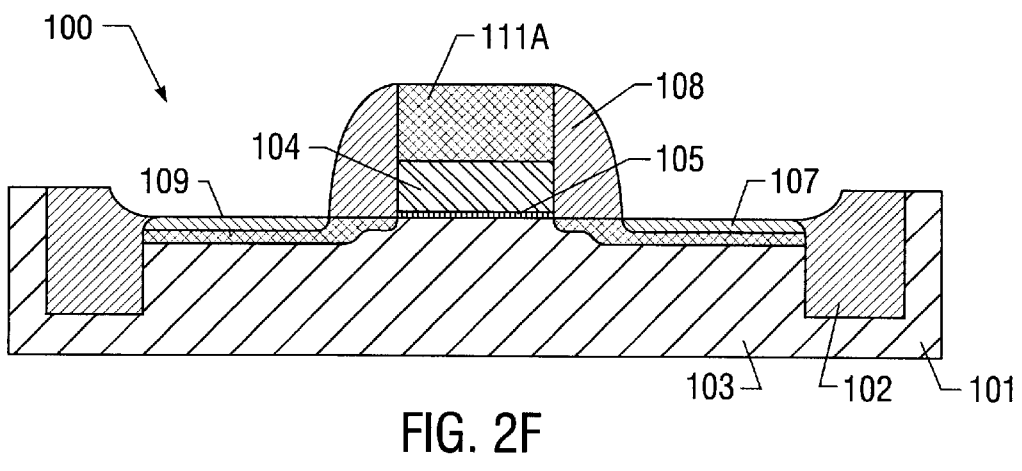

Next, as shown in FIG. 2E, a second layer of refractory metal 123 may be formed above the gate stack 122, the sidewall spacers 108, and the surface 124 of the source/drain regions 109. The second layer of refractory metal 123 may be comprised of any metal that may subsequently be converted into a metal silicide. For example, the second layer of refractory metal 123 may be comprised of cobalt, titanium, tantalum, platinum, tungsten, molybdenum, zirconium, nickel, or other like materials. The thickness of the second layer of refractory metal 123 may be varied as a matter of design choice, but it will usually have a thickness ranging from approximately 50–200 Å, and it may be formed by any of a variety of known techniques for forming such layers, e.g., PVD, CVD, etc. In one illustrative embodiment, the second layer of refractory metal 123 is comprised of cobalt having a thickness ranging from approximately 50–200 Å that is formed by a PVD process.

Thereafter, at least a portion of the second layer of refractory metal 123 is converted to a metal silicide by performing one or more anneal processes. In particular, during the anneal process, portions of the second layer of refractory metal 123 in contact with the surface 124 of the source/drain regions 109 are converted to metal silicide regions 107 (see FIG. 2F). Portions of the second refractory metal layer 50 that are unreacted during this conversion process may be removed by a subsequent acid rinse, for example, hydrochloric acid and peroxide or sulfuric acid and peroxide. These processes result in the structure depicted in FIG. 2F. Note that, during this silicidation process, portions of the thickness of the source/drain regions 109 are consumed.

The particular parameters of the anneal process used to form the metal silicide regions 109 are matters of design choice, and they may vary depending upon the thickness and composition of the second layer of refractory metal 123. The anneal process may be comprised of a two-step anneal processes in a rapid thermal anneal chamber. The duration and temperatures of the anneal process may be varied as a matter of design choice to insure that the second layer of refractory metal 123 reaches the appropriate temperature. In one illustrative example, where the second layer of refractory metal 123 is comprised of approximately 50–200 Å of cobalt, the anneal process may be comprised of a first step at about 450–600° C. for a duration of approximately 10–90 seconds, and a second step at about 750–900° C. for a duration of approximately 10–90 seconds.

As is clear from the foregoing, the first and second layers of refractory metal 110, 123 may be comprised of the same or different refractory metals. For example, the first layer of refractory metal 110 may be comprised of titanium, while the second layer of refractory metal 123 may be comprised of cobalt. Alternatively, both the first and second layers of refractory metal 110, 123 may be comprised of the same material, e.g., cobalt. Moreover, the thickness of the first and second layers of refractory metal 110, 123 may be very different.

Through use of the present invention, a transistor may be formed such that the metal silicide region 111A above the gate electrode 104 is of a different composition than that of the metal silicide region 107 formed on the source/drain regions 109. For example, the metal silicide region 111A formed above the gate electrode 104 may be comprised of titanium silicide (TiSi$_2$) while the metal silicide region 107 formed above the source/drain region 109 may be comprised of cobalt silicide (CoSi$_2$). Similarly, the metal silicide region 111A may be comprised of nickel silicide (NiSi) while the metal silicide region 107 may be comprised of cobalt silicide (CoSi$_2$).

Formation of the metal silicide regions 111A, 107 from different materials may be advantageous for a number of reasons. For example, the metal silicide regions 111A, 107 may be formed of different materials so as to enhance the performance of the transistor. That is, since the metal silicide region 111A will not be exposed to the source/drain region 109, it may be made very thick and without concern for the amount of the source/drain region 109 it would otherwise consume were the transistor fabricated using traditional silicide processing. In one illustrative embodiment, the metal silicide region 111A may be comprised of titanium silicide or nickel silicide so as to take advantage of its lower resistance as compared to that of other silicides, e.g., cobalt silicide, etc. In a similar vein, the metal silicide region 107 may be made of a silicide that is less aggressive in attacking the source/drain region 109, e.g., cobalt silicide.

Moreover, in the present invention, the metal silicide regions 111A and 107 may be very different in thickness. This is advantageous in that, even if the metal silicide regions 111A and 107 are made of the same material, the metal silicide region 111A may be made much thicker than that of the metal silicide region 107 on the source/drain region 109. The resulting transistor has improved electrical performance because the resistance of the gate electrode 104 is reduced, due to the increase in size of the metal silicide region 111A, while the metal silicide region 107 may be made much thinner, thereby avoiding excessive consumption of the source/drain region 109.

Figure 1B:
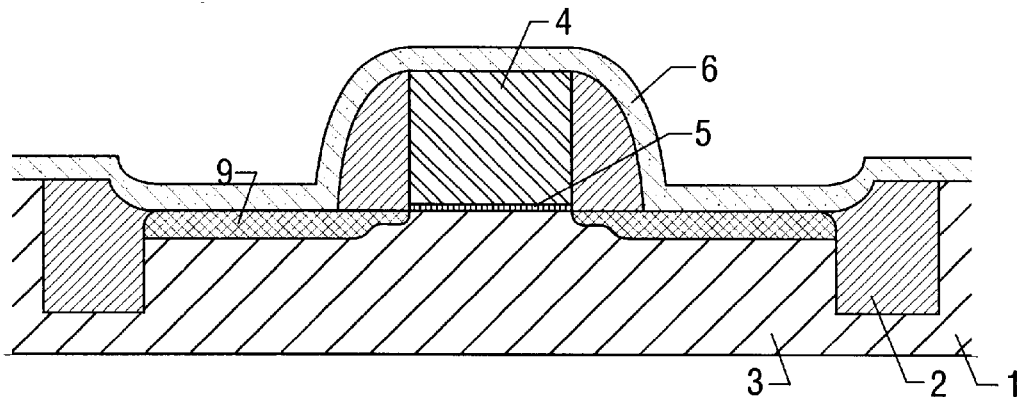
Figure 1C:
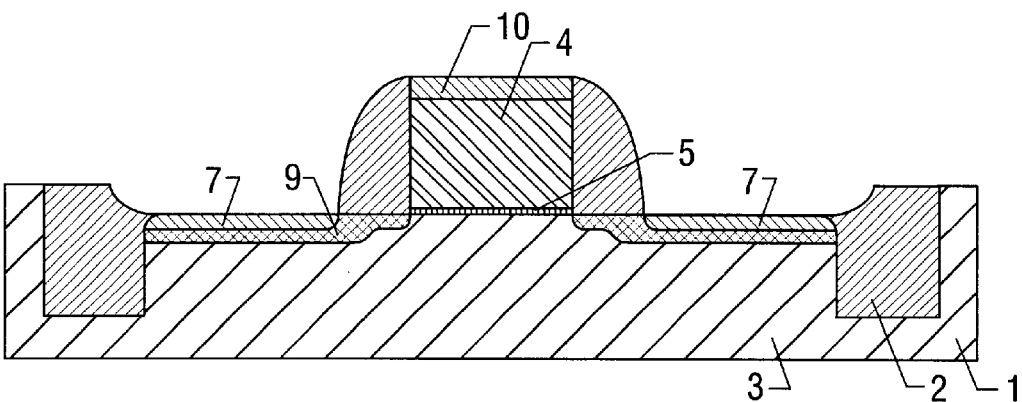

By way of example, in the situation where the first layer of refractory metal 110 has a thickness ranging from approximately 100–500 Å, and the second layer of refractory metal 123 has a thickness rangino from approximately 50–200 Å, the metal suicide region 111A may have a thickness ranging from approximately 350–1750 Å, and the metal silicide region 107 may have a thickness ranging from approximately 175–700 Å. That is, the ratio of the thickness of the metal silicide region 111A as compared to that of the metal silicide region 107 may vary between about 2–10. This is in contrast to prior art transistors (see FIG. 1A–1C) which resulted in the metal silicide region 10 above the gate conductor 4 having a thickness that was approximately the same as the thickness of the metal silicide region 7 formed on the source/drain regions 9 (see FIG. 1A–1C). A device having the above-described thickness ratios between the various silicide regions produces a transistor with enhanced electrical performance characteristics as described above.

The device described herein may also be manufactured using the methods described in our co-pending patent applications entitled "Method of Forming Metal Silicide Regions on a Gate Electrode and on the Source/Drain Regions of a Semiconductor Device", "Method of Forming a Low Resistance Metal Silicide Region on a Gate Electrode of a Transisto", and "Method of Forming a Transistor Having a Low-Resistance Gate Electrode", each of which are hereby incorporated by reference in their entirety.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

depositing a first layer comprised of silicon;

depositing a second layer comprised of titanium above said first layer;

converting at least a portion of said second layer to a first metal silicide layer comprised of titanium silicide;

patterning said first metal silicide layer and said first layer to define a portion of a gate stack comprised of a first metal silicide region and a layer comprised of silicon, said first metal silicide region having a thickness;

forming a plurality of source/drain regions in said substrate;

depositing a third layer comprised of cobalt above at least the gate stack and said source/drain regions; and converting at least a portion of the third layer to a second metal silicide region comprised of cobalt silicide above each of said source/drain regions, said second metal silicide region having a thickness, the thickness of said first metal silicide region being approximately 2–10 times as thick as the thickness of said second metal slicide region.

2. The method of claim 1, wherein forming a first layer comprised of silicon comprises forming a first layer comprised of at least one of polysilicon, amorphous silicon and microcrystalline silicon.

3. The method of claim 1, further comprising forming at least one sidewall spacer adjacent said gate stack.

4. The method of claim 1, wherein converting at least a portion of said second layer to a first metal silicide layer comprises performing at least one anneal process to convert at least a portion of said second layer to a first metal silicide layer.

5. The method of claim 1, wherein converting at least a portion of said second layer to a first metal silicide layer comprises performing a first rapid thermal anneal process at a temperature ranging from approximately 450–600° C. for a duration ranging from approximately 10–90 seconds, and a second rapid thermal anneal process at a temperature ranging from approximately 750–900° C. for a duration ranging from approximately 10–90 seconds to convert at least a portion of said second layer to a first metal silicide layer.

6. The method of claim 1, wherein patterning said first metal silicide layer and said first layer to define a portion of a gate stack comprised of a first metal silicide region and a layer comprised of silicon comprises etching said first metal silicide layer and said first layer to define a portion of a gate stack comprised of a first metal silicide region and a layer of polysilicon.

7. The method of claim 3, wherein forming at least one sidewall spacer adjacent said gate stack comprises depositing a layer of spacer material above said gate stack and performing at least one anisotropic etching process to define at least one sidewall spacer adjacent the gate stack.

8. The method of claim 1, wherein converting at least a portion of the third layer to a second metal silicide region above each of said source/drain regions comprises performing at least one anneal process to convert at least a portion of the third layer to a second metal silicide region above each of said source/drain regions.

9. The method of claim 1, wherein converting at least a portion of the third layer to a second metal silicide region above each of said source/drain regions comprises performing a first rapid thermal anneal process at a temperature ranging from approximately 450–600° C. for a duration ranging from approximately 10–90 seconds, and a second rapid thermal anneal process at a temperature ranging from approximately 750–900° C. for a duration ranging from approximately 10–90 seconds to convert at least a portion of the third layer to a second metal silicide region.

10. A method, comprising:

depositing a first layer comprised of polysilicon;

depositing a second layer comprised of titanium having a thickness ranging from approximately 350–1500 Å above said first layer;

converting at least a portion of said second layer to a first metal silicide layer comprised of titanium silicide;

etching at least said first metal silicide layer and said first layer to define a portion of a gate stack comprised of a first metal silicide region and a layer of polysilicon;

forming a plurality of source/drain regions in said substrate;

depositing a third layer comprised of cobalt having a thickness ranging from approximately 50–200 Å above at least the gate stack and said source/drain regions; and converting at least a portion of the third layer to a second metal silicide region comprised of cobalt silicide above each of said source/drain regions.

11. The method of claim 10, further comprising forming at least one sidewall spacer adjacent said gate stack.

12. The method of claim 10, wherein converting at least a portion of said second layer to a first metal silicide layer comprises performing at least one anneal process to convert at least a portion of said second layer to a first metal silicide layer.

13. The method of claim 10, wherein converting at least a portion of said second layer to a first metal silicide layer comprises performing a first rapid thermal anneal process at a temperature ranging from approximately 450–600° C. for a duration ranging from approximately 10–90 seconds, and a second rapid thermal anneal process at a temperature ranging from approximately 750–900° C. for a duration ranging from approximately 10–90 seconds to convert at least a portion of said second layer to a first metal silicide layer.

14. The method of claim 10, wherein forming at least one sidewall spacer adjacent said gate stack comprises depositing a layer of spacer material above said gate stack and performing at least one anisotropic etching process to define at least one sidewall spacer adjacent the gate stack.

15. The method of claim 10, wherein converting at least a portion of the third layer to a second metal silicide region comprises performing at least one anneal process to convert at least a portion of the third layer to a second metal silicide region.

16. The method of claim 10, wherein converting at least a portion of the third layer to a second metal silicide region comprises performing a first rapid thermal anneal process at a temperature ranging from approximately 450–600° C. for a duration ranging from approximately 10–90 seconds, and a second rapid thermal aincal process at a temperature ranging from approximately 750–900° C. for a duration ranging from approximately 10–90 seconds to convert at least a portion of the third layer to a second metal silicide region.

17. The method of claim 10, wherein converting at least a portion of the third layer to a second metal silicide region above each of said source/drain regions comprises converting at least a portion of the third layer to a second metal silicide region above each of said source/drain regions, said first metal silicide region having a thickness, said second metal silicide region having a thickness, the thickness of said first metal silicide region being approximately 2–10 times as thick as the thickness of said second metal silicide region.

* * * * *